(12) United States Patent  
Chittipeddi et al.

(10) Patent No.: US 7,563,669 B2  
(45) Date of Patent: Jul. 21, 2009

(54) INTEGRATED CIRCUIT WITH A TRENCH CAPACITOR STRUCTURE AND METHOD OF MANUFACTURE

(75) Inventors: Sailesh Chittipeddi, Newport Beach, CA (US); Seungmoo Choi, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 387 days.

(21) Appl. No.: 11/383,670

(22) Filed: May 16, 2006

(65) Prior Publication Data

US 2007/0267670 A1    Nov. 22, 2007

(51) Int. Cl.  
*H01L 21/8242* (2006.01)  
*H01L 21/108* (2006.01)

(52) U.S. Cl. .................. 438/243; 438/239; 438/242; 438/245; 438/386; 257/301; 257/302; 257/E21.651; 257/E21.653; 257/E27.092

(58) Field of Classification Search .................. 438/239, 438/243, 245, 386; 257/301, 302  
See application file for complete search history.

(56) References Cited

U.S. PATENT DOCUMENTS

| | | | | |
|---|---|---|---|---|
| 4,890,145 | A * | 12/1989 | Malhi | 257/302 |
| 5,936,271 | A * | 8/1999 | Alsmeier et al. | 257/301 |
| 6,638,813 | B1 * | 10/2003 | Tzeng et al. | 438/244 |
| 6,833,302 | B2 * | 12/2004 | Sitaram | 438/243 |
| 2004/0061161 | A1 * | 4/2004 | Radens et al. | 257/301 |
| 2005/0148140 | A1 * | 7/2005 | Brown et al. | 438/243 |
| 2005/0186730 | A1 * | 8/2005 | Hsu | 438/243 |
| 2008/0124863 | A1 * | 5/2008 | Cheng et al. | 438/243 |

* cited by examiner

*Primary Examiner*—Dao H Nguyen

(57) ABSTRACT

An integrated circuit device having a capacitor structure. In one form of the invention, an integrated circuit device includes a capacitor structure formed along a surface of a semiconductor layer. The capacitor structure includes a region formed in the semiconductor surface, a layer of dielectric material formed along a trench wall of the trench region and a first layer of doped polysilicon formed over the layer of dielectric material in the trench region. The capacitor structure further includes a second layer of doped polysilicon formed over the first layer of polysilicon.

7 Claims, 9 Drawing Sheets

INTEGRATED CIRCUIT WITH A TRENCH CAPACITOR STRUCTURE AND METHOD OF MANUFACTURE

FIELD OF THE INVENTION

The present invention relates to integrated circuit devices and, more particularly, to capacitor designs and memory circuits incorporating capacitors.

BACKGROUND OF THE INVENTION

With continued increases in the density of integrated circuit devices there are greater challenges to achieve performance requirements such as high circuit speed and noise immunity. Random Access Memory (RAM) circuits are often included in systems-on-a chip (SOC's) wherein such is referred to as embedded memory. Maximizing the speed and error immunity of RAM circuits often requires trade-offs with manufacturing costs. The trade-offs are often, for example, a function of device density or the number of photolithographic steps required to produce desired features. Optimization of memory circuit performance must also be in the context of meeting performance requirements necessary for other circuit components and functions of the SOC. It is of interest to find ways to improve memory circuit performance while having minimal or no impact on overall manufacturing costs and SOC performance.

The embedded memory of these systems may include Static RAM (SRAM), Dynamic RAM (DRAM), or Pseudo-SRAM (PSRAM) circuits. SRAM circuits have the fastest read-write access times of all semiconductor random access memory devices. The memory cell in a conventional SRAM circuit consists of cross-coupled inverters with which one of two stable states is selected. The circuit remains in a stable state as long as power is delivered to the memory cell. In addition to requiring significant power, the conventional SRAM cell design includes six field effect or bipolar transistors formed in monocrystalline semiconductor material. In contrast, DRAM cells only require one transistor and a charge-storing capacitor device, requiring less than one third the space of a conventional SRAM cell. Variants of the SRAM cell design have certain of the transistors replaced with high impedance resistors (e.g., >$10^{10}$ ohms) or thin film transistors in order to reduce the area required on the semiconductor surface.

While DRAM circuits provide the most area efficient memory storage, the time required for read-write operations is much greater than that of SRAM circuits, and DRAM circuits require refresh operations due to leakage of the charge storage capacitor. The refresh operation is normally performed in response to an externally initiated chip-enable refresh signal by which rows of memory cells are sequentially addressed. In contrast, PSRAM circuitry incorporates timer circuits to generate internal (on-chip) signals which automatically perform the sequential refresh of rows of memory cells. PSRAM circuit architecture is based on DRAM cell design, further including logic to effect automatic refresh. Thus a PSRAM circuit incorporates an area efficient DRAM structure to provide SRAM functionality albeit with somewhat slower performance that that of an SRAM circuit. A PSRAM cell is, generally, up to two thirds the size of the smallest SRAM cell.

One of the challenges in the design of embedded memory circuits relates to the amount of charge density which can be stored in capacitor structures such as used for DRAM and PSRAM circuits. As device sizes are scaled to smaller dimensions it is increasingly difficult to provide the level of capacitance needed to accomodate bit line voltage drops of the type encountered in low voltage designs. Relatively high levels of capacitance are also required to avoid loss of information such as may result from soft errors, e.g. radiation induced charges. Manufacturing constraints and charge leakage across relatively thin dielectric materials necessitate other means to increase the amount of charge and the overall capacitance in memory cells of this type. Use of dielectric compounds in lieu of conventional materials such as silicon oxide has so far not proven to be a viable alternative in the volume manufacture of SOC's.

Generally, scaling of DRAM and PSRAM circuits requires a decrease in cell size while sustaining an ability to store nearly the same amount of charge. In the past this has generated the transition from plate capacitors, i.e., planar designs, to cells which accumulate charge along a three-dimensional structure such as a trench. The capacitor structure may be formed within or above the monocrystalline semiconductor material. Even so, continued progress to even higher levels of integration causes charge storage to remain a key challenge in sustaining acceptable memory performance. Accordingly there is need for capacitor structures which allow for higher levels of charge storage while the size of the memory cell is scaled to smaller dimensions.

SUMMARY OF THE INVENTION

In one aspect of the invention, a plurality of devices are formed along a semiconductor layer and electrically connected to form an integrated circuit. One of the devices includes a first pass transistor and a capacitor structure configured to form a one-transistor memory cell in a memory array, with the cell configuration including a trench formed in the semiconductor surface. A layer of dielectric material is formed along a wall of the trench and a first layer of doped polysilicon is formed over the layer of dielectric material in the trench. A second layer of doped polysilicon is formed over the first layer of polysilicon.

Generally, in one form of the invention, an integrated circuit device includes a capacitor structure formed along a surface of a semiconductor layer. The capacitor structure includes a trench region formed in the semiconductor surface, a layer of dielectric material formed along a wall of the trench region and a first layer of doped polysilicon formed over the layer of dielectric material in the trench region. The capacitor structure further includes a second layer of doped polysilicon formed over the first layer of polysilicon.

In an embodiment of an associated method of forming an integrated circuit device, a trench is formed in the upper surface of a semiconductor layer. The trench includes a bottom portion and a wall portion extending from the upper surface to the bottom portion. A layer of dielectric material is formed on the wall portion. A first conductive polysilicon layer is formed along the wall portion. A second polysilicon layer is formed over the first conductive polysilicon layer.

BRIEF DESCRIPTION OF THE DRAWINGS

The following detailed description can be more readily understood, and the advantages and uses of the present invention will be more apparent, when the description is read in conjunction with the figures wherein.

In accordance with common practice, various described device features presented in the figures are not drawn to scale to emphasize specific features relevant to the invention. Like reference characters denote like elements throughout the figures and text.

DETAILED DESCRIPTION OF THE INVENTION

Before describing in detail an example integrated circuit device according to the invention, it is noted that the invention resides primarily in a novel and non-obvious combination of elements and method steps. So as to not obscure the description, details of elements and steps pertinent to the invention are emphasized in the figures and written description, without illustrating in the figures certain associated elements and steps which are otherwise conventional and which will be readily apparent to those skilled in the art.

Figure 2:
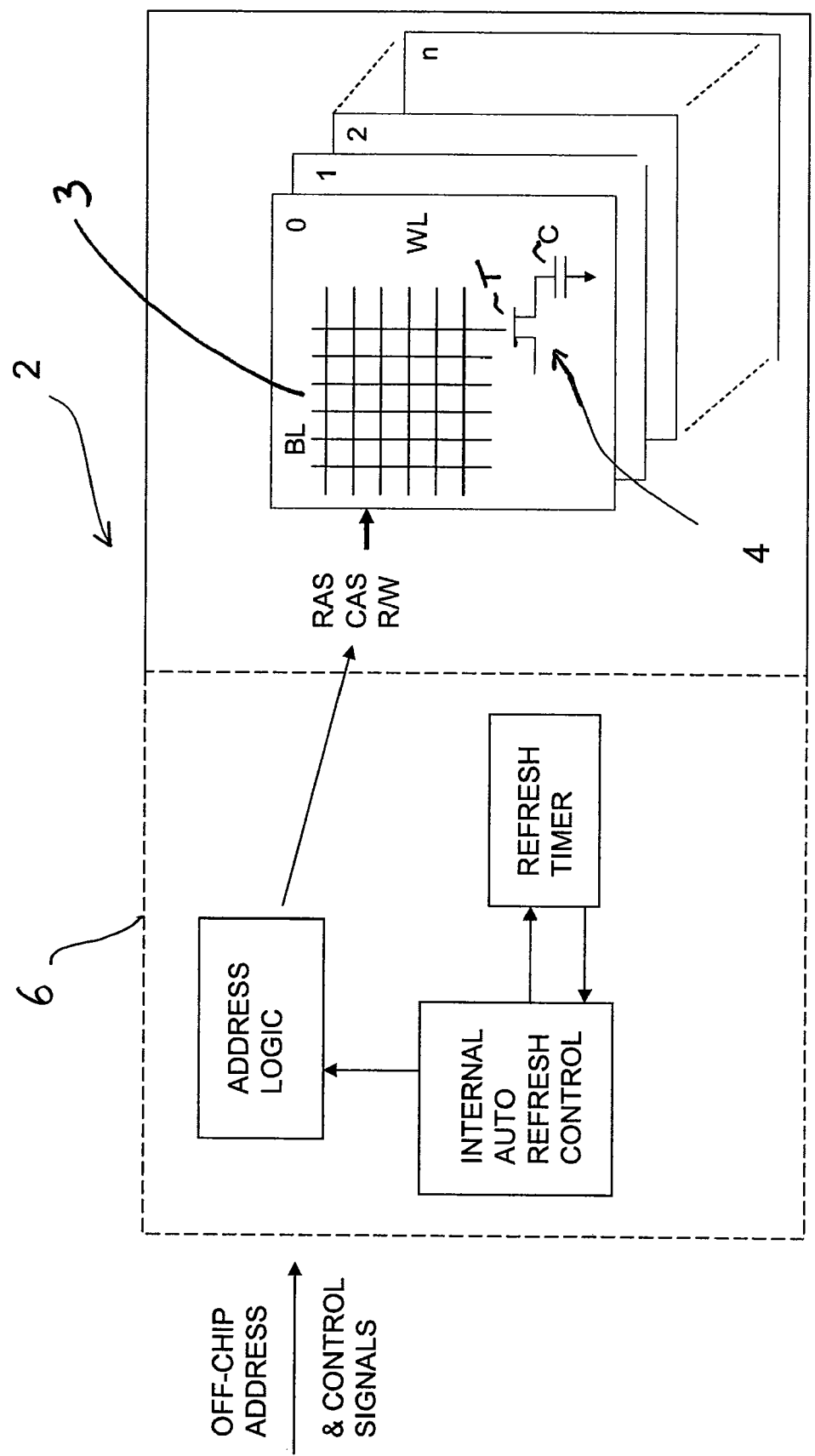
FIG. 2 illustrates, in a simplified, partial block diagram, a memory circuit incorporating the exemplary memory cell of FIG. 1.

Referring initially to FIG. 2, there is shown in a simplified schematic diagram a RAM circuit 2 incorporating an array 3 of memory cells 4 arranged along rows of Bit Lines BL and columns of Word Lines WL. As illustrated for one such cell, each memory cell 4 in the array includes a transistor T and a capacitor C. According to the invention, the capacitors are formed in trench regions as now described for an exemplary embodiment. For embodiments wherein the circuit 2 is a PSRAM, an optional block 6 comprises on-chip refresh circuitry internal to the circuit 2.

Figure 1A:
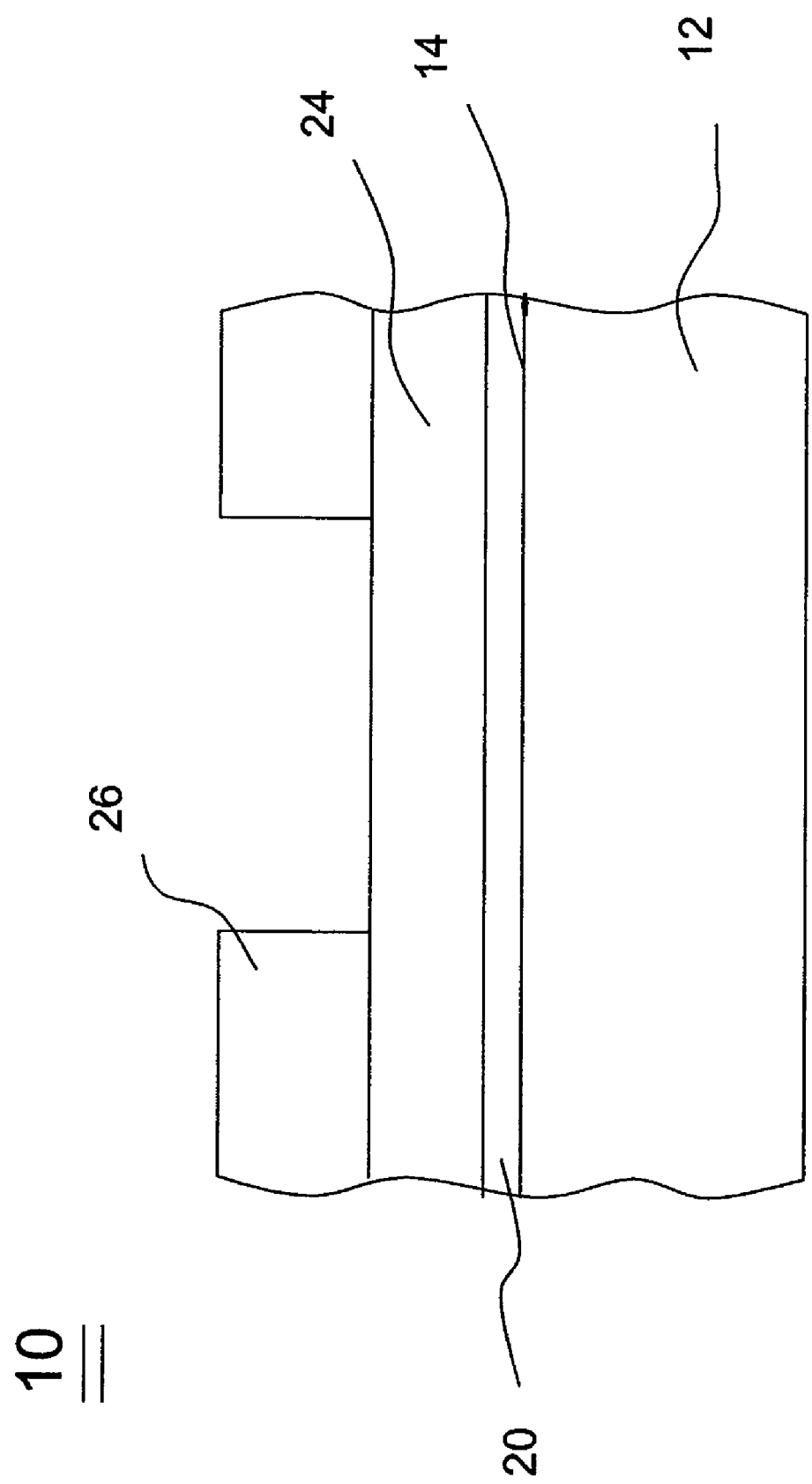
FIGS. 1A through 1H illustrate a sequence of manufacturing steps for a memory cell including a capacitor according to the invention.

FIG. 1a illustrates in cross sectional view a partially fabricated semiconductor structure 10 on which the circuit 2 is fabricated according to the invention. The structure includes a semiconductor substrate 12 formed of monocrystalline silicon, although the structure 10 may be formed of other semiconductor materials. The illustrated substrate 12 includes an upper surface 14 which may be formed in an epitaxially grown sublayer formed therein. The sublayer may also be monocrystalline silicon, although it may comprise other semiconductor material such as SiGe. A pad oxide layer 20 has been formed over the surface 14 by thermal oxidation of semiconductor material along the surface 14. A layer 24 of silicon nitride has been deposited over the pad oxide layer 20 as an initial step in a conventional photolithographic sequence to form shallow trench isolation regions.

Figure 1B:
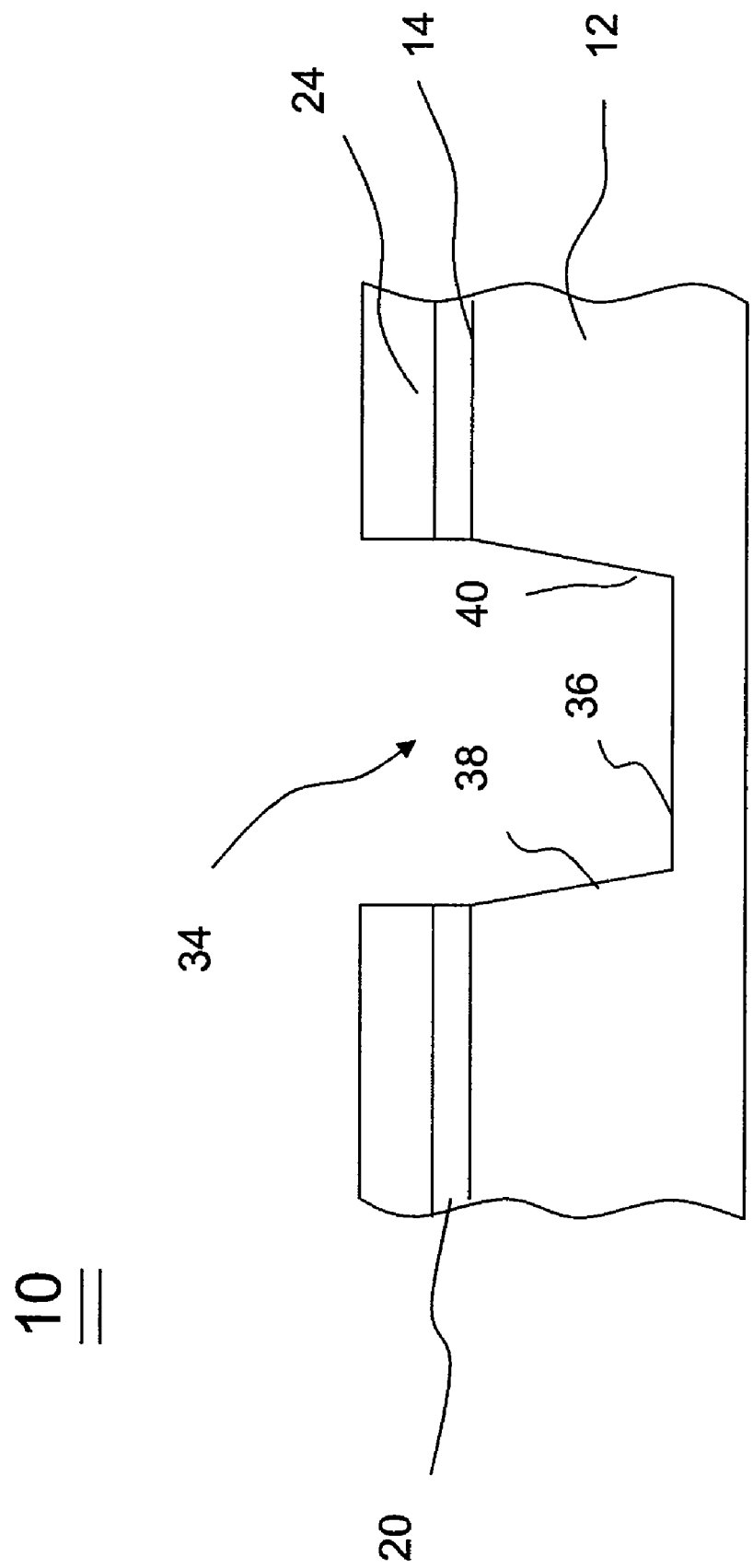

A patterned layer 26 of photoresist is formed over the nitride layer 24. The structure 10 is then etched through the nitride layer 24, the pad oxide layer 20 and into the substrate 12 to form a trench 34 having a lower surface 36 and first and second opposing side walls 38, 40 extending from the lower surface to the semiconductor upper surface 14. See FIG. 1B. Although a single trench 34 is illustrated in the figures, it is to be understood that a plurality of such formations are simultaneously formed in order to provide (i) shallow trench isolation between transistor devices along the upper surface 12, and (ii) capacitor regions each associated with one or more pass transistors to create memory cells according to the invention.

Figure 1C:
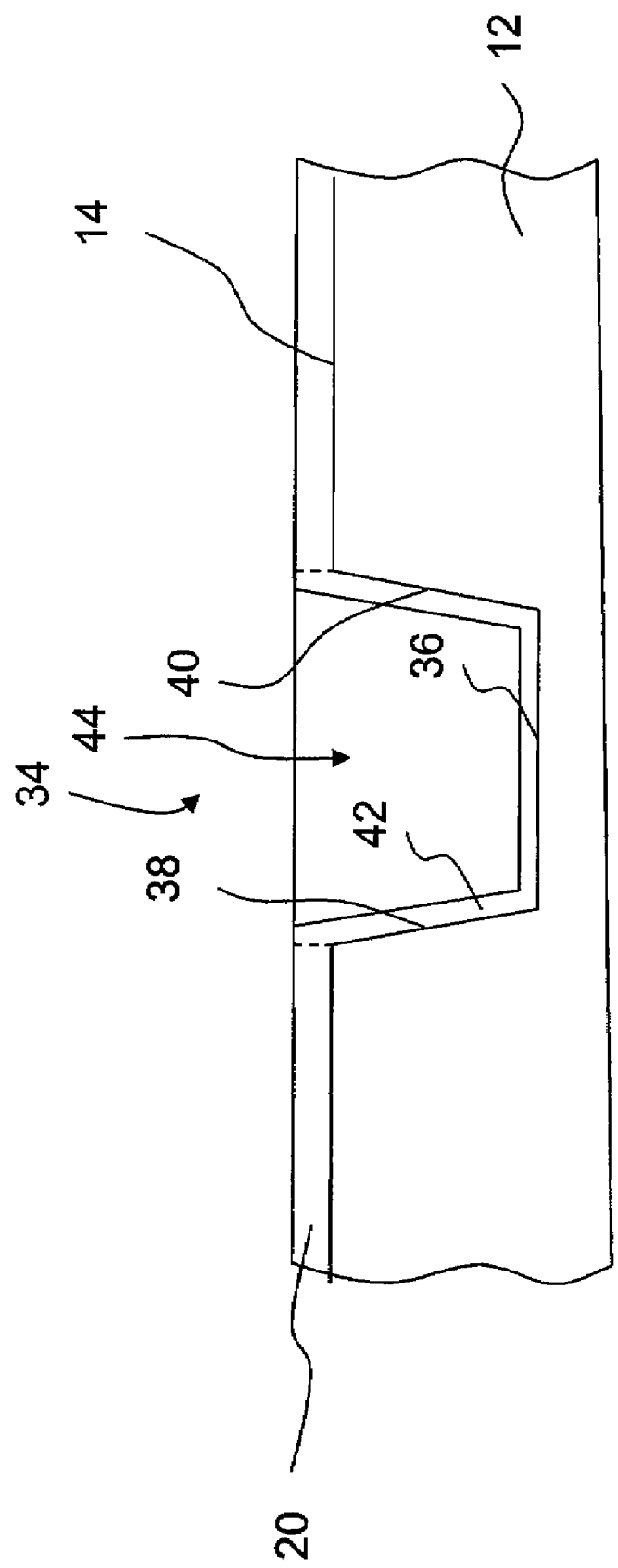
Figure 1D:
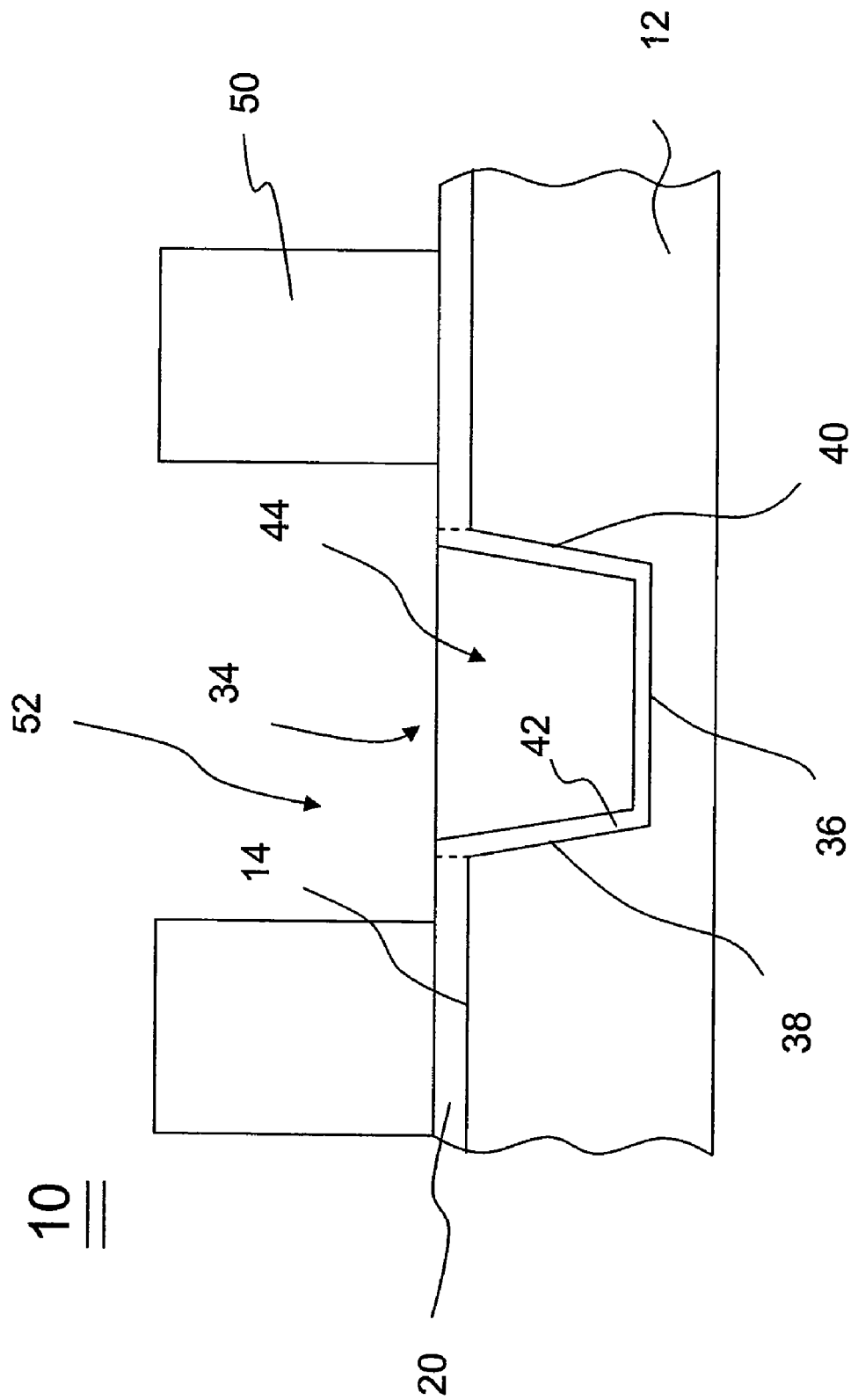

As illustrated in FIG. 1C the trench 34 undergoes further processing common to formation of shallow trench isolation regions. A thermally grown silicon oxide liner layer 42 is formed along the trench lower surface 36 and side walls 38 and 40. A silicon oxide layer 44 is deposited, e.g., with a high density plasma (HDP) process, over the liner layer to fill the trench 34 and cover the silicon nitride layer 24. The deposition is followed by a sequence of reverse toner oxide lithography and etch steps and a planarizing chemical-mechanical polish. This results in removal of the nitride layer 24 and reduction of the deposited oxide 44 to the level of the pad oxide layer 20. At this point in the fabrication sequence the trench 34 and other like structures formed along the surface 14 are fully defined shallow trench isolation structures.

Further description of the fabrication sequence set forth in FIG. 1 illustrates formation of an exemplary capacitor region 46 (see FIG. 1H) in and about the trench 34. Additional capacitor regions 46 may be formed in the trench 34 and other like trenches formed along the surface 14 in order to fabricate an array of memory cells.

Although the capacitor region 46 is illustrated in association with a memory cell 4, trench capacitor regions may be fabricated according to the invention for other circuit functions as well. In the example embodiment the trench 34 (see FIG. 1C) extends in directions orthogonal to the view of FIG. 1 to provide a series of capacitor regions in each of multiple trenches 34. The capacitor regions 46 are positioned between pairs of pass transistors 48. Each capacitor region 46 is capable of separately storing a different charge along each of the trench sidewalls 38 and 40 in association with a different one of the pass transistors. The transistors 48 are illustrated as P-channel devices but may be N-channel devices.

Figure 1E:
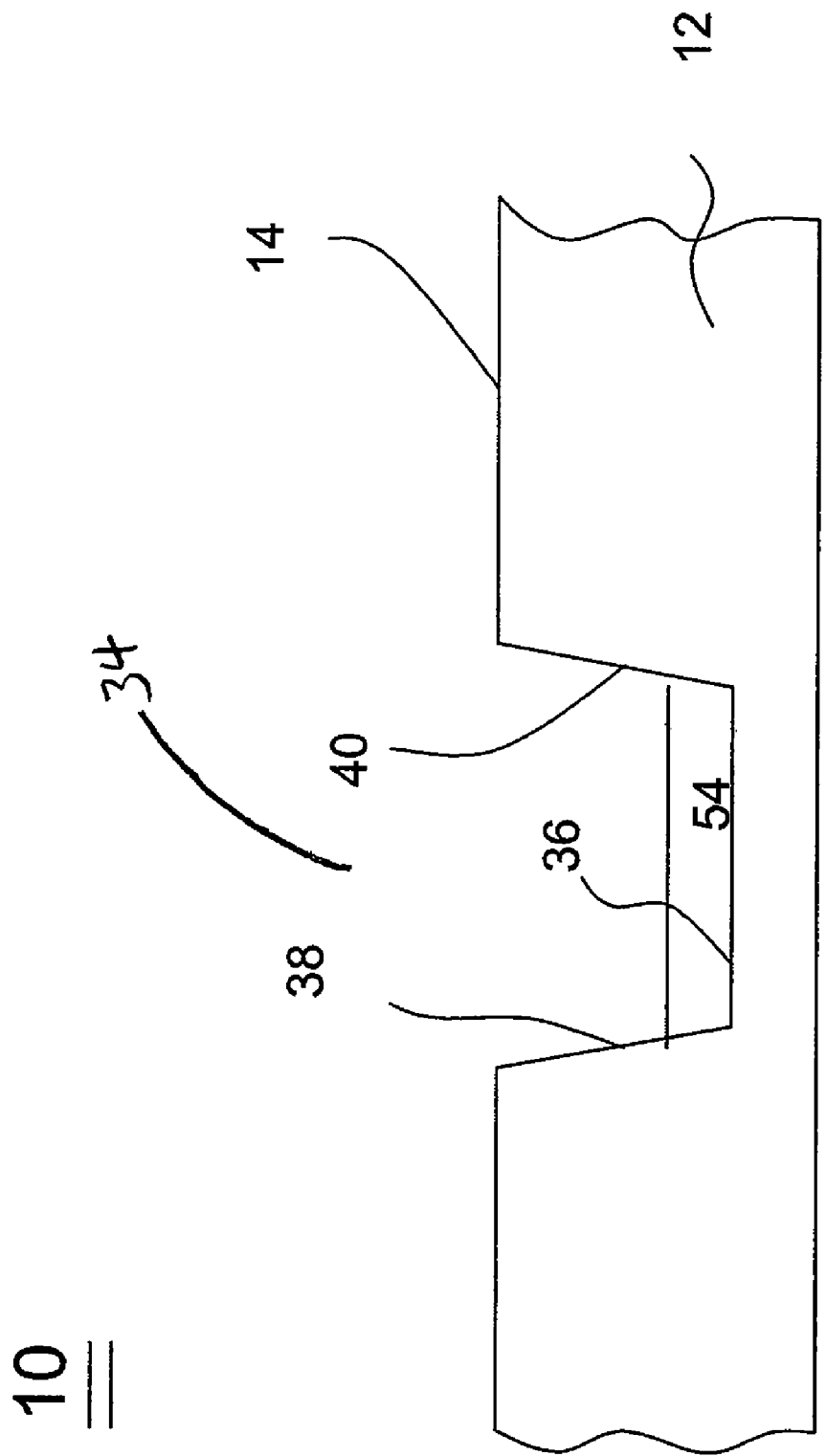
Figure 1F:
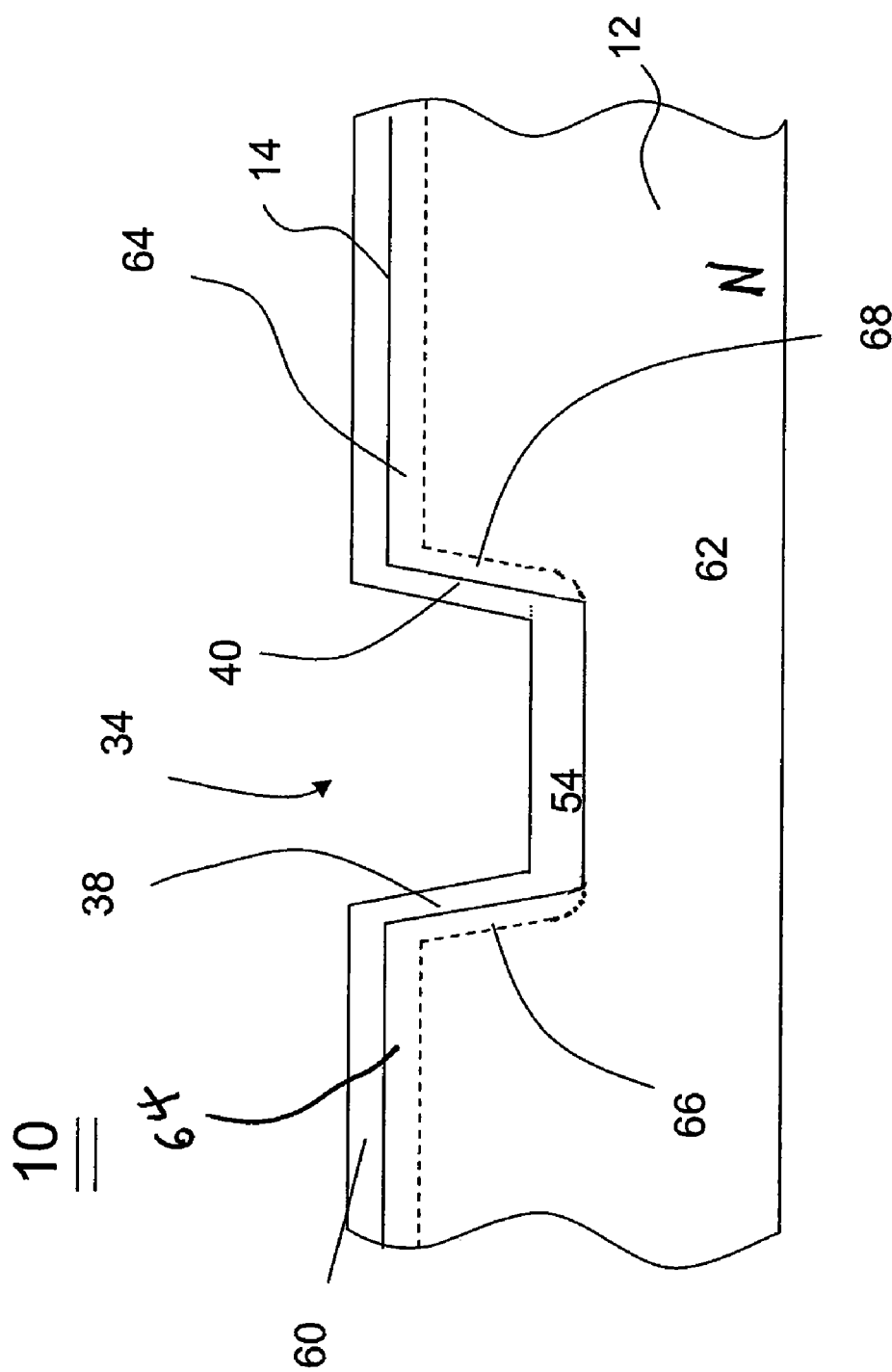

Subsequent to formation of shallow isolation structures like the trench 34 of FIG. 1C, ones of the shallow isolation structures that are intended to function only as shallow trench isolation regions are masked off as a layer of photoresist 50 is deposited and patterned to define an opening 52 above the trenches 34. See FIG. 1D. A portion of the silicon oxide 44 is then removed from the trench 34 with an oxide etch chemistry, leaving a layer 54, comprising HDP-deposited silicon oxide and portions of the liner oxide 42, along the trench lower surface 36. The photoresist 50 is then stripped and the pad oxide layer 20 is etched away from the region of the surface 14 about the trench 34 as shown in FIG. 1E. The layer 54 is of sufficient thickness, e.g., 500 to 1,000 Angstroms, to block subsequent implant dopant from reaching the region below the lower trench surface 36.

Next a sacrificial silicon oxide layer 60 is grown over the surface 14, followed by appropriate mask and implant steps to define an N-well 62 in portions of the substrate 12 about the trench 34 for fabrication of P-channel transistors 48. Although not illustrated, P-wells may be formed in other regions along the surface 14 during simultaneous formation of N-channel devices and other P-channel devices not relating to the memory device. Threshold adjust regions 64 are formed by ion implantation for each of the two P-channel pass transistors 48 being formed in the N-well 62. The threshold adjust regions extend along the sidewalls 38 and 40 to provide a first lower capacitor plate 66 along the trench sidewall 38 and a second lower capacitor plate 68 along the trench sidewall 40. After processing is complete, the lower capacitor plates 66 and 68, and other portions of the threshold adjust regions 64 have a net dopant concentration in the range of $1 \times 10^{16}$ to $5 \times 10^{18}$ $cm^{-3}$, depending on the threshold requirement. With each transistor 48 being formed on a different side of the trench 34, each transistor will be able to pass a voltage signal along a threshold adjust region 64 to a different one of the capacitor plates 66 and 68. See FIG. 1F.

The sacrificial oxide layer 60 is removed and a high quality gate oxide layer 70 is thermally grown along the surface 14 to a thickness in the range of 20-30 Angstroms, including a portion 70a thereof formed in the trench 34. This is followed by an in-situ doped deposition (e.g., by chemical vapor deposition) to form a polysilicon layer 72 ranging up to 300 Angstroms in thickness, preferably between 100 and 200 Angstroms in thickness, and having a p-type, e.g., boron, concentration in the range of $5\times10^{18}$ cm$^{-3}$ to $1\times10^{20}$ cm$^{-3}$, e.g., on the order of $10^{19}$ cm$^{-3}$. Portions of the layer 72 formed in the trench 34 provide an upper plate region 74 operable in conjunction with one or both of the lower plates 66 and 68 while the portion 70a of the gate oxide layer serves as a capacitor dielectric. In lieu of the in-situ doped deposition which forms the layer 72, an undoped layer of polysilicon may be formed, followed by deposition of a layer which readily out-diffuses dopant, such as borosilicate glass (BSG) or another capping layer with a suitable dopant type that will then be removed, e.g., by etching. If the gate oxide for the peripheral devices is required to be different from the capacitor oxide, the thin poly silicon will be removed from the transistor area. Following this, the gate oxide will be thermally grown.

After the layer 72 is formed and any overlying material, such as BSG, is removed, a 2000 Angstrom layer 76 of polysilicon is deposited over the substrate 12 by chemical vapor deposition, filling the trench 34 and covering regions of the surface 14 for patterning of polysilicon gate runners. The polysilicon layer 76 then receives a low energy implant, e.g., $6.0\times10^{15}$ cm$^{-2}$ of phosphorous at 35 KeV and retains a characteristic dopant implant profile as may be modified by diffusion. Alternately, the implant could be P-type dopant (e.g., Boron or BF$_2$). See FIG. 1G, which also illustrates photoresist 80 patterned to define (i) a capacitor plate contact 82 in the capacitor region 46, and (ii) a pair of gate structures 84 each formed in spaced-apart relation to one of the trench sidewalls 38 and 40.

The gates structures 84 each include a polysilicon gate runner 85 having the same characteristic dopant implant profile, as may be modified by thermal diffusion during subsequent fabrication steps, as the capacitor plate contact 82. See, also, FIG. 1H, which illustrates these features on the structure 10 after the capacitor contact 82 and the gate structures 84 have been defined, the photoresist 80 has been removed and spacer elements 86 have been formed along sidewalls of the contact 82 and gate structures 84. Portions of the capacitor contact 82 along the upper capacitor plate region 74 may have sufficient dopant concentration to serve as part of a charge storing plate in conjunction with the plate region 74 when one of the pass transistors 46 conducts current to a lower plate 66 or 68.

Figure 1G:
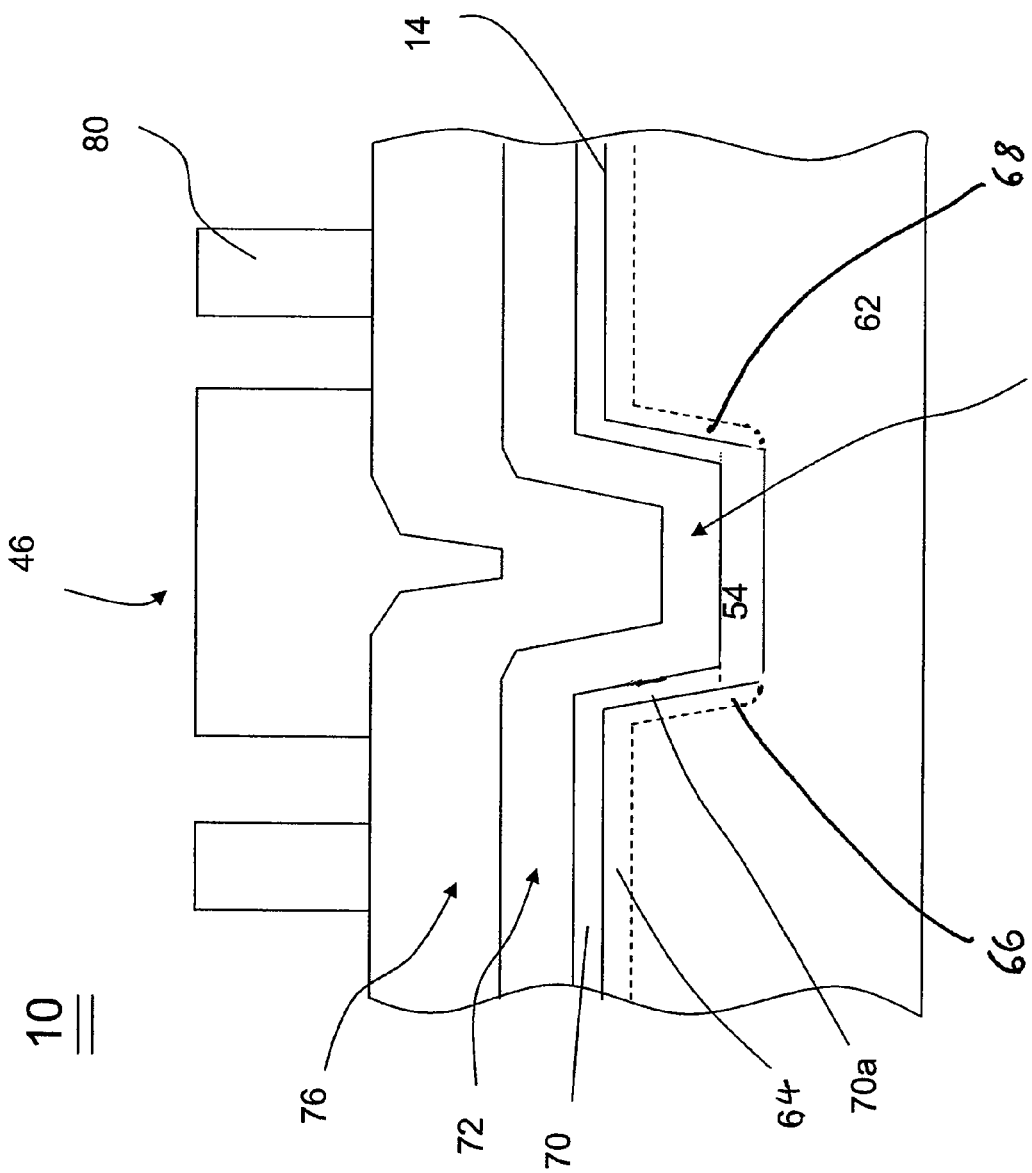
Figure 1H:
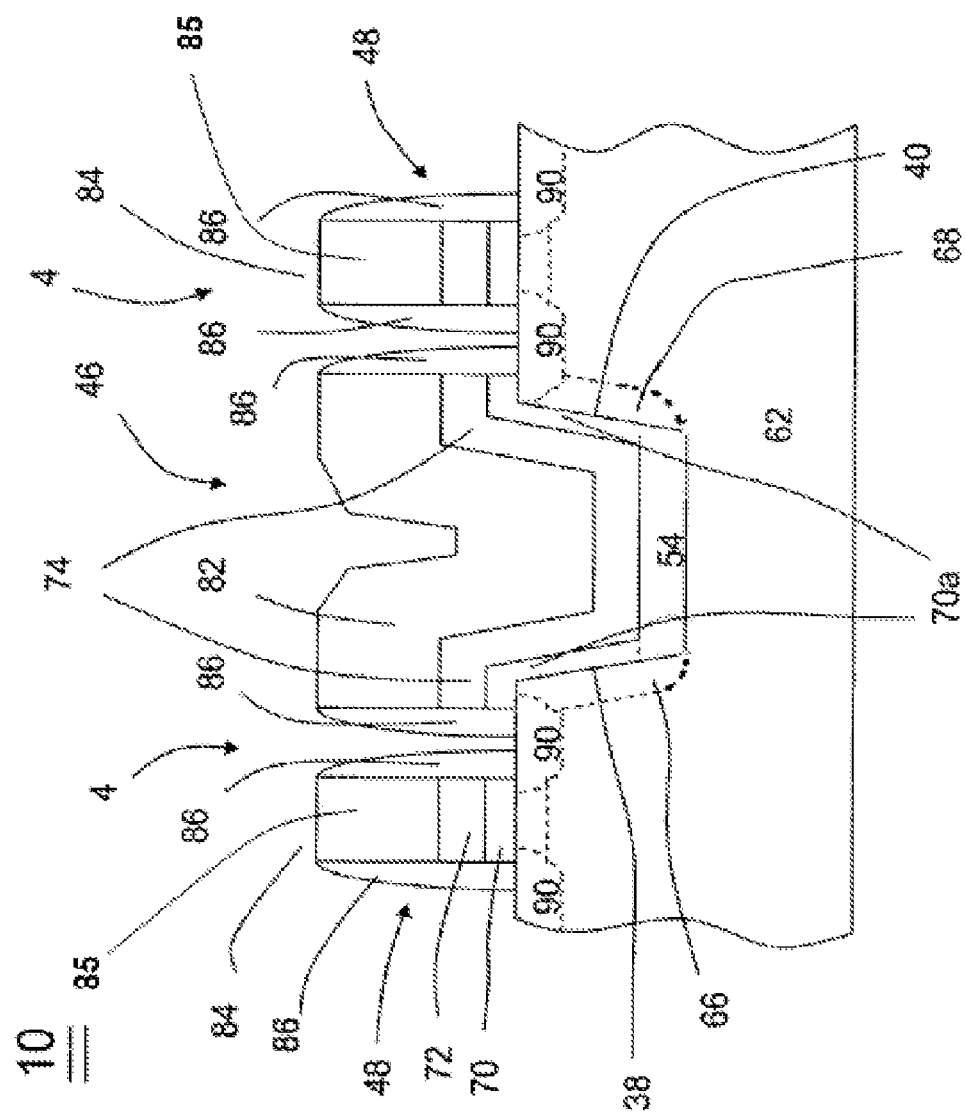

Source/drain implant regions 90 comprise lightly doped drain implants, made before the spacer elements 86 are formed, and heavier dopant implants made after the spacer elements have been formed. The resulting pass transistors 48 are shown in FIG. 1G as formed on each side of the capacitor region 46.

A feature of the capacitor region 46 is that the in situ doped capacitor plate region 64 is formed with a substantially uniform dopant concentration along the layer 54 of HDP silicon oxide and along portions of the oxide liner layer 42 formed on the trench side walls 38 and 40. The region 64 may, as illustrated, extend along the surface 14 toward each of the pass transistors 48. This in-situ doped region provides a layer of highly doped semiconducting material on the silicon oxide layer 70, along the trench sidewalls 38 and 40, e.g., with sufficient dopant concentration to assure there is no depletion when the region 64 is being charged as a capacitor plate.

In comparison to the structure of the layer 74, prior conductor layers used to form a capacitor plate in a trench have been characterized by a dopant implantation profile having a relatively lower dopant concentration along the interface with the capacitor dielectric layer. This is partly a result of the polysilicon layer within the trench having been formed of a single layer which receives implantation of dopant material to achieve conductive properties. Due to the nature of the trench geometry and the directionality and energy of the implant process, the resulting capacitor conductor material had a limited and undesirably low dopant concentration along the associated interface with the capacitor dielectric.

A feature of the invention is that the implanted layer 76 of polysilicon forms both the gate runners 85 and the contact region 82 of the capacitor. Advantageously, the layer 76 may also be used to form gate runners for other transistor devices, e.g., logic circuitry on the structure 10 or on other integrated circuits constructed according to the invention. While it is possible to form the regions comprising the plate region 74, the contact region 82 and the gate runners with an in situ doped deposition, such would not be preferred due to post deposition out-diffusion of the dopant.

The in-situ doped capacitor plate region 74, even after implantation and diffusion of dopant from the overlying layer 76, may retain a substantially uniform net dopant concentration along the interface with the dielectric 70a. Depending on the relative concentration of dopant initially formed in the region 74 and the implanted layer 76, dopant level in the region 74 may increase or decrease as a result of subsequent diffusion. If substantially higher levels of dopant are implanted with sufficient energy into the layer 76, compared with the in-situ concentration present in the layer 74, then the first layer of polysilicon may include a composite dopant profile which includes a contribution characteristic of implant and diffusion based on the implant profile relating to the layer of polysilicon 76 and any implantation extending into the region 74.

While an example embodiment of the invention has been illustrated, numerous other applications of the disclosed capacitor structure, as well as other methods of fabricating the structure, will be apparent to those skilled in the art. Various changes may also be made to disclosed embodiments and equivalent elements may be substituted without departing from the scope of the present invention. Therefore, the invention is not limited to particular embodiments disclosed, but will include all embodiments falling within the scope of the appended claims.

We claim:

1. A method of forming an integrated circuit device, comprising:

providing a semiconductor layer having an upper surface;

forming a trench in the semiconductor layer upper surface, the trench having a bottom portion and a wall portion extending from the upper surface to the bottom portion;

growing by thermal oxidation a layer of silicon oxide on said bottom portion and along the wall portion, depositing a high density plasma silicon oxide over the thermal oxidation layer of silicon oxide and filing the trench with the high density plasma silicon oxide;

removing a portion of the high density plasma silicon oxide from the trench to leave a remaining layer of the high density plasma silicon oxide on the bottom portion, the removing including removing the thermal oxidation layer of silicon oxide from the wall portion;

implanting ions in the semiconductor layer in the region adjacent said wall portion to form a first capacitor plate;

forming a layer of dielectric material on the wall portion;

forming an in-situ doped first polysilicon layer along the wall portion to form a second capacitor plate having a substantially uniform dopant concentration along the remaining layer of the high density plasma and along the layer of dielectric material on the wall portion; and depositing a second doped polysilicon layer over the doped first polysilicon layer, wherein the second doped polysilicon layer is formed over the doped first polysilicon layer within the trench and is patterned to form both a conductive layer over the first layer and a gate runner for a transistor.

2. The method of claim 1 wherein the second layer of polysilicon is doped by ion implantation.

3. The method of claim 1 wherein a layer of silicon oxide is formed along a lower portion of the trench with the doped first conductive polysilicon layer formed thereover.

4. The method of claim 1 wherein the doped first conductive polysilicon layer is formed to have a thickness of at least 100 Angstroms and by an in situ doped deposition providing a net dopant concentration of at least $5 \times 10^{18}$ cm$^{-3}$ in said polysilicon layer, said method further including the step of implanting dopant into said second polysilicon layer.

5. The method of claim 1 further including formation of a transistor device having a gate oxide layer and a gate runner wherein the step of depositing said second polysilicon Layer includes depositing of material which forms the gate runner.

6. The method of claim 1 wherein the second layer of polysilicon is characterized by a dopant implant profile.

7. The method of claim 6 wherein the doped first conductive polysilicon layer has a dopant profile produced by inducing diffusion from the implant profile of the second layer of polysilicon.

* * * * *